(12) United States Patent
Slack et al.

(10) Patent No.: US 9,525,032 B2
(45) Date of Patent: *Dec. 20, 2016

(54) DOPED ALUMINUM NITRIDE CRYSTALS AND METHODS OF MAKING THEM

(71) Applicants: Glen A. Slack, Scotia, NY (US); Leo J. Schowalter, Latham, NY (US)

(72) Inventors: Glen A. Slack, Scotia, NY (US); Leo J. Schowalter, Latham, NY (US)

(73) Assignee: CRYSTAL IS, INC., Green Island, NY (US)

(*) Notice: Subject to any disclaimer, the term of this patent is extended or adjusted under 35 U.S.C. 154(b) by 358 days.

This patent is subject to a terminal disclaimer.

(21) Appl. No.: 14/225,999

(22) Filed: Mar. 26, 2014

(65) Prior Publication Data

US 2014/0231725 A1    Aug. 21, 2014

Related U.S. Application Data

(63) Continuation of application No. 12/642,182, filed on Dec. 18, 2009, now Pat. No. 8,747,552, which is a continuation of application No. 11/633,667, filed on Dec. 4, 2006, now Pat. No. 7,641,735.

(60) Provisional application No. 60/741,701, filed on Dec. 2, 2005.

(51) Int. Cl.
| | |
|---|---|
| *C30B 29/38* | (2006.01) |
| *H01L 29/20* | (2006.01) |
| *C30B 23/00* | (2006.01) |
| *C30B 29/40* | (2006.01) |

(52) U.S. Cl.
CPC ........... *H01L 29/2003* (2013.01); *C30B 23/00* (2013.01); *C30B 29/403* (2013.01)

(58) Field of Classification Search
CPC .............................. C30B 29/38; C30B 29/403
See application file for complete search history.

(56) References Cited

U.S. PATENT DOCUMENTS

| | | | |
|---|---|---|---|
| 3,531,245 A | 9/1970 | Dietz | |
| 3,600,701 A | 8/1971 | Gouldthorpe | |
| 3,603,414 A | 9/1971 | Stebley | |
| 3,607,014 A | 9/1971 | Huml et al. | |
| 3,634,149 A | 1/1972 | Knippenberg et al. | |
| 3,768,983 A | 10/1973 | Elkins et al. | |
| 3,903,357 A | 9/1975 | Woolfson et al. | |
| 3,933,573 A | 1/1976 | Dugger | |
| 4,008,851 A | 2/1977 | Hirsch | |

(Continued)

FOREIGN PATENT DOCUMENTS

| | | |
|---|---|---|
| CN | 2492947 | 5/2002 |
| CN | 201274297 Y | 7/2009 |

(Continued)

OTHER PUBLICATIONS

Notification to Pay Further Search Fee for European Patent Application No. 06844590.7 mailed on Feb. 6, 2015, 9 pages.

(Continued)

*Primary Examiner* — Robert M Kunemund
(74) *Attorney, Agent, or Firm* — Morgan, Lewis & Bockius LLP

(57) ABSTRACT

Fabrication of doped AlN crystals and/or AlGaN epitaxial layers with high conductivity and mobility is accomplished by, for example, forming mixed crystals including a plurality of impurity species and electrically activating at least a portion of the crystal.

24 Claims, 3 Drawing Sheets

(56) References Cited

U.S. PATENT DOCUMENTS

| | | |
|---|---|---|
| 4,088,515 A | 5/1978 | Blakeslee et al. |
| 4,234,554 A | 11/1980 | Rabenau et al. |
| 4,547,471 A | 10/1985 | Huseby et al. |
| 5,057,287 A | 10/1991 | Swiggard |
| 5,070,393 A | 12/1991 | Nakagawa et al. |
| 5,087,949 A | 2/1992 | Haitz |
| 5,292,487 A | 3/1994 | Tatsumi et al. |
| 5,312,698 A | 5/1994 | Sato et al. |
| 5,494,861 A | 2/1996 | Yamaga et al. |
| 5,520,785 A | 5/1996 | Evans et al. |
| 5,525,320 A | 6/1996 | Pratsinis et al. |
| 5,571,603 A | 11/1996 | Utumi et al. |
| 5,670,798 A | 9/1997 | Schetzina |
| 5,679,965 A | 10/1997 | Schetzina |
| 5,703,397 A | 12/1997 | Endo et al. |
| 5,728,635 A | 3/1998 | Kobayashi et al. |
| 5,858,085 A | 1/1999 | Arai et al. |
| 5,858,086 A | 1/1999 | Hunter |
| 5,868,837 A | 2/1999 | DiSalvo et al. |
| 5,909,036 A | 6/1999 | Tanaka et al. |
| 5,924,874 A | 7/1999 | Gotoh et al. |
| 5,954,874 A | 9/1999 | Hunter |
| 5,972,109 A | 10/1999 | Hunter |
| 5,981,980 A | 11/1999 | Miyajima et al. |
| 6,000,174 A | 12/1999 | Yamazaki et al. |
| 6,001,748 A | 12/1999 | Tanaka et al. |
| 6,006,620 A | 12/1999 | Lawrie et al. |
| 6,045,612 A | 4/2000 | Hunter |
| 6,048,813 A | 4/2000 | Hunter |
| 6,063,185 A | 5/2000 | Hunter |
| 6,066,205 A | 5/2000 | Hunter |
| 6,086,672 A | 7/2000 | Hunter |
| 6,091,085 A | 7/2000 | Lester |
| 6,187,089 B1 | 2/2001 | Phillips et al. |
| 6,211,089 B1 | 4/2001 | Kim et al. |
| 6,270,569 B1 | 8/2001 | Shibata et al. |
| 6,296,956 B1 | 10/2001 | Hunter |
| 6,398,867 B1 | 6/2002 | D'Evelyn et al. |
| 6,404,125 B1 | 6/2002 | Garbuzov et al. |
| 6,447,604 B1 | 9/2002 | Flynn et al. |
| 6,468,347 B1 | 10/2002 | Motoki et al. |
| 6,515,308 B1 | 2/2003 | Kneissl et al. |
| 6,533,874 B1 | 3/2003 | Vaudo et al. |
| 6,548,405 B2 | 4/2003 | Kraus et al. |
| 6,592,663 B1 | 7/2003 | Sarayama et al. |
| 6,596,079 B1 | 7/2003 | Vaudo et al. |
| 6,719,843 B2 | 4/2004 | Schowalter et al. |
| 6,770,135 B2 | 8/2004 | Schowalter et al. |
| 6,777,717 B1 | 8/2004 | Karlicek |
| 6,791,119 B2 | 9/2004 | Slater, Jr. et al. |
| 6,800,876 B2 | 10/2004 | Edmond et al. |
| 6,831,302 B2 | 12/2004 | Erchak et al. |
| 6,840,431 B1 | 1/2005 | Kim |
| 6,861,729 B2 | 3/2005 | Kozaki et al. |
| 6,891,268 B2 | 5/2005 | Tomiya et al. |
| 6,921,929 B2 | 7/2005 | LeBoeuf et al. |
| 6,936,357 B2 | 8/2005 | Melnik et al. |
| 6,940,075 B2 | 9/2005 | Schulz |
| 6,995,402 B2 | 2/2006 | Ludowise et al. |
| 7,026,659 B2 | 4/2006 | Slater, Jr. et al. |
| 7,037,738 B2 | 5/2006 | Sugiyama et al. |
| 7,037,838 B2 | 5/2006 | Schowalter et al. |
| 7,056,383 B2 | 6/2006 | Helava et al. |
| 7,063,741 B2 | 6/2006 | D'Evelyn et al. |
| 7,087,112 B1 | 8/2006 | Rojo et al. |
| 7,095,054 B2 | 8/2006 | Fjelstad |
| 7,125,734 B2 | 10/2006 | Sackrison et al. |
| 7,186,580 B2 | 3/2007 | Tran et al. |
| 7,211,146 B2 | 5/2007 | Schowalter et al. |
| 7,211,831 B2 | 5/2007 | Erchak et al. |
| 7,244,520 B2 | 7/2007 | Kumakura et al. |
| 7,250,637 B2 | 7/2007 | Shimizu et al. |
| 7,274,043 B2 | 9/2007 | Erchak et al. |
| 7,276,779 B2 | 10/2007 | Shibata |
| 7,288,152 B2 | 10/2007 | Kitaoka et al. |
| 7,420,218 B2 | 9/2008 | Nagai |
| 7,420,222 B2 | 9/2008 | Slater, Jr. et al. |
| 7,439,552 B2 | 10/2008 | Takigawa et al. |
| 7,476,910 B2 | 1/2009 | Fujimoto et al. |
| 7,518,158 B2 | 4/2009 | Keller et al. |
| 7,524,376 B2 | 4/2009 | Wang |
| 7,554,128 B2 | 6/2009 | Okamoto et al. |
| 7,631,986 B2 | 12/2009 | Harrah |
| 7,638,346 B2 | 12/2009 | Schowalter et al. |
| 7,641,735 B2 | 1/2010 | Slack et al. |
| 7,674,699 B2 | 3/2010 | Shibata |
| 7,678,195 B2 | 3/2010 | Schlesser et al. |
| 7,713,844 B2 | 5/2010 | Nishiura et al. |
| 7,750,355 B2 | 7/2010 | Dwilinski et al. |
| 7,755,103 B2 | 7/2010 | Ueno |
| 7,776,153 B2 | 8/2010 | Schowalter |
| 7,803,733 B2 | 9/2010 | Teratani et al. |
| 7,902,566 B2 | 3/2011 | Paolini et al. |
| 7,943,952 B2 | 5/2011 | Loh et al. |
| 7,956,372 B2 | 6/2011 | Kamada et al. |
| 7,976,186 B2 | 7/2011 | Loh |
| 8,012,257 B2 | 9/2011 | Morgan et al. |
| 8,080,833 B2 | 12/2011 | Grandusky et al. |
| 8,088,220 B2 | 1/2012 | Slack et al. |
| 8,123,859 B2 | 2/2012 | Schowalter et al. |
| 8,222,650 B2 | 7/2012 | Schowalter et al. |
| 8,323,406 B2 | 12/2012 | Bondokov et al. |
| 8,349,077 B2 | 1/2013 | Bondokov et al. |
| 8,545,629 B2 | 10/2013 | Schowalter et al. |
| 8,580,035 B2 | 11/2013 | Bondokov et al. |
| 8,747,552 B2 | 6/2014 | Slack et al. |
| 8,834,630 B2 | 9/2014 | Bondokov et al. |
| 8,896,020 B2 | 11/2014 | Schowalter et al. |
| 8,962,359 B2 | 2/2015 | Schowalter et al. |
| 2001/0000209 A1 | 4/2001 | Krames et al. |
| 2001/0005023 A1 | 6/2001 | Itoh et al. |
| 2001/0024871 A1 | 9/2001 | Yagi |
| 2001/0051433 A1 | 12/2001 | Francis et al. |
| 2002/0030194 A1 | 3/2002 | Camras et al. |
| 2002/0170490 A1 | 11/2002 | Vodakov et al. |
| 2003/0047816 A1 | 3/2003 | Dutta |
| 2003/0160254 A1 | 8/2003 | Henrichs |
| 2003/0168003 A1 | 9/2003 | Schowalter et al. |
| 2003/0213964 A1 | 11/2003 | Flynn |
| 2003/0216011 A1 | 11/2003 | Nakamura et al. |
| 2004/0033690 A1 | 2/2004 | Schowalter et al. |
| 2004/0104442 A1 | 6/2004 | Feudel et al. |
| 2004/0130002 A1 | 7/2004 | Weeks et al. |
| 2004/0187766 A1 | 9/2004 | Letertre |
| 2004/0206978 A1 | 10/2004 | Saxler |
| 2004/0213309 A9 | 10/2004 | Amano et al. |
| 2004/0224484 A1 | 11/2004 | Fareed et al. |
| 2004/0226917 A1 | 11/2004 | Laconto et al. |
| 2004/0245535 A1 | 12/2004 | D'Evelyn et al. |
| 2004/0251471 A1 | 12/2004 | Dwilinski et al. |
| 2005/0062392 A1 | 3/2005 | Sakai et al. |
| 2005/0072986 A1 | 4/2005 | Sasaoka |
| 2005/0103257 A1 | 5/2005 | Xu et al. |
| 2005/0142391 A1 | 6/2005 | Dmitriev et al. |
| 2005/0161697 A1 | 7/2005 | Nakahata et al. |
| 2005/0164044 A1 | 7/2005 | Melnik et al. |
| 2005/0214992 A1 | 9/2005 | Chakraborty et al. |
| 2005/0269577 A1 | 12/2005 | Ueda et al. |
| 2005/0277214 A1 | 12/2005 | Uematsu et al. |
| 2005/0285141 A1 | 12/2005 | Piner et al. |
| 2006/0005763 A1 | 1/2006 | Schowalter et al. |
| 2006/0029832 A1 | 2/2006 | Xu et al. |
| 2006/0054075 A1 | 3/2006 | Dwilinski et al. |
| 2006/0118820 A1 | 6/2006 | Gaska et al. |
| 2006/0181695 A1 | 8/2006 | Sage, Jr. |
| 2006/0244011 A1 | 11/2006 | Saxler |
| 2006/0255341 A1 | 11/2006 | Pinnington et al. |
| 2006/0281205 A1 | 12/2006 | Park |
| 2006/0288929 A1 | 12/2006 | Slack et al. |
| 2007/0018184 A1 | 1/2007 | Beeson et al. |
| 2007/0082019 A1 | 4/2007 | Huang et al. |
| 2007/0101932 A1 | 5/2007 | Schowalter et al. |
| 2007/0102721 A1 | 5/2007 | DenBaars et al. |
| 2007/0131160 A1 | 6/2007 | Slack et al. |

(56) References Cited

U.S. PATENT DOCUMENTS

| | | |
|---|---|---|
| 2007/0134827 A1 | 6/2007 | Bondokov et al. |
| 2007/0151905 A1 | 7/2007 | Wang et al. |
| 2007/0224714 A1 | 9/2007 | Ikeda et al. |
| 2007/0243653 A1 | 10/2007 | Morgan et al. |
| 2007/0257333 A1 | 11/2007 | Schlesser et al. |
| 2008/0006200 A1 | 1/2008 | Schowalter et al. |
| 2008/0012034 A1 | 1/2008 | Thielen et al. |
| 2008/0023719 A1 | 1/2008 | Camras et al. |
| 2008/0036038 A1 | 2/2008 | Hersee et al. |
| 2008/0054280 A1 | 3/2008 | Reginelli et al. |
| 2008/0087984 A1 | 4/2008 | Melas |
| 2008/0121910 A1 | 5/2008 | Bergmann et al. |
| 2008/0123711 A1 | 5/2008 | Chua et al. |
| 2008/0135861 A1 | 6/2008 | Pokrovskiy et al. |
| 2008/0142817 A1 | 6/2008 | Ibbetson et al. |
| 2008/0144688 A1 | 6/2008 | Chua et al. |
| 2008/0149945 A1 | 6/2008 | Nagai |
| 2008/0149960 A1 | 6/2008 | Amo et al. |
| 2008/0157111 A1 | 7/2008 | Erchak et al. |
| 2008/0173887 A1 | 7/2008 | Baba et al. |
| 2008/0182092 A1 | 7/2008 | Bondokov et al. |
| 2008/0187016 A1 | 8/2008 | Schowalter et al. |
| 2008/0191225 A1 | 8/2008 | Medendorp |
| 2008/0246047 A1 | 10/2008 | Hsu et al. |
| 2008/0251808 A1 | 10/2008 | Kususe et al. |
| 2008/0258165 A1 | 10/2008 | Zimmerman et al. |
| 2009/0008654 A1 | 1/2009 | Nagai |
| 2009/0014742 A1 | 1/2009 | Erchak |
| 2009/0039373 A1 | 2/2009 | Saito et al. |
| 2009/0050050 A1 | 2/2009 | Slack et al. |
| 2009/0065791 A1 | 3/2009 | Yen et al. |
| 2009/0065792 A1 | 3/2009 | Thompson et al. |
| 2009/0078957 A1 | 3/2009 | Hoshina |
| 2009/0090932 A1 | 4/2009 | Bour et al. |
| 2009/0121246 A1 | 5/2009 | Denbaars et al. |
| 2009/0121250 A1 | 5/2009 | DenBaars et al. |
| 2009/0140279 A1 | 6/2009 | Zimmerman et al. |
| 2009/0141502 A1 | 6/2009 | Sonoda et al. |
| 2009/0155989 A1 | 6/2009 | Uematsu et al. |
| 2009/0159910 A1 | 6/2009 | Lin et al. |
| 2009/0166657 A1 | 7/2009 | Yamada et al. |
| 2009/0173958 A1 | 7/2009 | Chakraborty et al. |
| 2009/0233394 A1 | 9/2009 | Batres et al. |
| 2009/0239357 A1 | 9/2009 | Amano et al. |
| 2009/0256163 A1 | 10/2009 | Chakraborty |
| 2009/0261372 A1 | 10/2009 | Ueda |
| 2009/0267098 A1 | 10/2009 | Choi |
| 2009/0278148 A1 | 11/2009 | Nabekura et al. |
| 2009/0283028 A1 | 11/2009 | Schowalter et al. |
| 2009/0315054 A1 | 12/2009 | Kim et al. |
| 2009/0321758 A1 | 12/2009 | Liu et al. |
| 2009/0321771 A1 | 12/2009 | Hattori et al. |
| 2010/0006870 A1 | 1/2010 | Lee et al. |
| 2010/0012956 A1 | 1/2010 | Yoo |
| 2010/0025717 A1 | 2/2010 | Fujii et al. |
| 2010/0025719 A1 | 2/2010 | Li |
| 2010/0135349 A1 | 6/2010 | Schowalter et al. |
| 2010/0187541 A1 | 7/2010 | Slack et al. |
| 2010/0264460 A1 | 10/2010 | Grandusky et al. |
| 2010/0314551 A1 | 12/2010 | Bettles et al. |
| 2011/0008621 A1 | 1/2011 | Morgan et al. |
| 2011/0008923 A1 | 1/2011 | Lin et al. |
| 2011/0011332 A1 | 1/2011 | Rojo et al. |
| 2012/0000414 A1 | 1/2012 | Bondokov et al. |
| 2012/0021175 A1 | 1/2012 | Moody et al. |
| 2012/0104355 A1 | 5/2012 | Grandusky et al. |
| 2012/0146047 A1 | 6/2012 | Kneissl et al. |
| 2013/0026525 A1 | 1/2013 | Chen et al. |
| 2013/0082237 A1 | 4/2013 | Northrup et al. |
| 2013/0099141 A1 | 4/2013 | Chua |
| 2013/0152852 A1 | 6/2013 | Bondokov et al. |
| 2013/0157442 A1 | 6/2013 | Bondokov et al. |
| 2014/0061666 A1 | 3/2014 | Schowalter et al. |
| 2014/0093671 A1 | 4/2014 | Bondokov et al. |
| 2014/0203311 A1 | 7/2014 | Schowalter et al. |
| 2014/0264263 A1 | 9/2014 | Grandusky et al. |
| 2015/0013592 A1 | 1/2015 | Bondokov et al. |
| 2015/0020731 A1 | 1/2015 | Bondokov et al. |
| 2015/0079329 A1 | 3/2015 | Schowalter et al. |

FOREIGN PATENT DOCUMENTS

| | | |
|---|---|---|
| CN | 101680115 A | 3/2010 |
| CN | 103038400 A | 4/2013 |
| DE | 10248964 A1 | 4/2004 |
| EP | 0609799 A2 | 8/1994 |
| EP | 0811708 A2 | 12/1997 |
| EP | 0979883 A1 | 2/2000 |
| EP | 1211715 A2 | 6/2002 |
| EP | 1544925 A2 | 6/2005 |
| EP | 1732145 A2 | 12/2006 |
| EP | 1754810 A1 | 2/2007 |
| EP | 1852528 | 11/2007 |
| EP | 2099068 | 9/2009 |
| EP | 2287367 | 2/2011 |
| EP | 2588651 A1 | 5/2013 |
| JP | 61236686 A | 10/1986 |
| JP | 02018379 | 1/1990 |
| JP | 03285075 A | 12/1991 |
| JP | 04-355920 A | 12/1992 |
| JP | 9-83016 A | 3/1997 |
| JP | 0031059 | 1/2000 |
| JP | 2000154090 A | 6/2000 |
| JP | 2001192647 | 7/2001 |
| JP | 2002-274996 A | 9/2002 |
| JP | 2003-197541 A | 7/2003 |
| JP | 2005-167275 A | 6/2005 |
| JP | 2005-210084 A | 8/2005 |
| JP | 2006-511432 A | 4/2006 |
| JP | 06/169173 | 6/2006 |
| JP | 2006-319107 A | 11/2006 |
| JP | 06/335608 | 12/2006 |
| JP | 2011-60986 A | 3/2011 |
| JP | 2013-32287 A | 2/2013 |
| JP | 2013-155112 A | 8/2013 |
| JP | 2013-542155 A | 11/2013 |
| WO | WO-99/34037 A1 | 7/1999 |
| WO | WO-0022203 A1 | 4/2000 |
| WO | WO-01/11116 A1 | 2/2001 |
| WO | WO-03007383 | 1/2003 |
| WO | WO-03081730 A2 | 10/2003 |
| WO | WO-2004/061896 A2 | 7/2004 |
| WO | WO-2005/012602 A1 | 2/2005 |
| WO | 2006/110512 A1 | 10/2006 |
| WO | WO-2007062250 A2 | 5/2007 |
| WO | WO-2007/113537 | 10/2007 |
| WO | WO-2008042020 A2 | 4/2008 |
| WO | WO-2008/088838 | 7/2008 |
| WO | 2012/003304 A1 | 1/2012 |
| WO | 2012/012010 A2 | 1/2012 |
| WO | 2014/151264 A1 | 9/2014 |

OTHER PUBLICATIONS

Examination Report Received for European Patent Application No. 06844804.2 mailed on Jan. 30, 2015, 5 pages.

Examination Report Received for Japanese Application No. 2004-564684 mailed on Feb. 3, 2010.

Examination Report Received for Japanese Application No. 2004-564684 mailed on Jun. 24, 2009.

Examination Report Received for Chinese Patent Application No. 2011800323553 mailed on Jan. 4, 2015, 12 pages. (8 pages of English Translation & 4 pages of Official copy).

Allerman et al., "Growth and Design of Deep-UV (240-290 nm) Light Emitting Diodes Using AlGaN Alloys", J Crystal Growth, vol. 272, No. 1-4, Dec. 10, 2004, pp. 227-241.

Examination Report received for Chinese Patent Application No. 200880005464.4, mailed on Sep. 9, 2013, 10 pages (7 pages of English Translation and 3 pages of Official Copy).

Examination Report Received for Chinese Patent Application No. 2008800054644, mailed on Mar. 31, 2014, 7 pages. (4 pages of English Translation & 3 pages of Official copy).

(56) References Cited

OTHER PUBLICATIONS

Examination Report Received for Chinese Patent Application No. 200880005464.4, mailed on Jul. 3, 2014, 7 pages. (3 pages of English Translation & 4 pages of Official copy).
Examination Report Received for European Patent Application No. 07774299.7, mailed on Jul. 25, 2014, 6 pages.
Examination Report received for Japanese Patent Application No. 2009-547307, mailed on Apr. 8, 2014, 7 pages (3 pages of English Translation and 4 page of Official copy).
Examination Report Received for Japanese Patent Application No. 2013-518701, mailed on Sep. 24, 2014, 5 pages. (2 pages of English Translation and 3 pages of Official Copy).
Nishida et al., "AlGaN-Based Ultraviolet Light-Emitting Diodes Grown on Bulk AlN Substrates", Applied Physics Letters, vol. 84, No. 6, Feb. 9, 2004, pp. 1002-1003.
PCT International Patent Application No. PCT/US2011/042571, International Preliminary Report on Patentability mailed Jan. 17, 2013, 10 pages.
PCT International Patent Application No. PCT/US2014/025317, International Search Report and Written Opinion mailed Aug. 27, 2014, 13 pages.
Schujman et al., "Very Low Dislocation Density AlN Substrates for Device Applications", Proc. of SPIE, 2006, vol. 6121, 2006, pp. 61210K-1-1210K-7.
Akiba et al., "Growth of Flat p-GaN Contact Layer by Pulse Flow Method for High Light-Extraction AlGaN Deep-UV LEDs with Al-Based Electrode", Phys. Status Solidi (C), vol. 9, No. 3-4, 2012, pp. 806-809.
Ali et al., "Enhancement of Near-UV GaN LED Light Extraction Efficiency by GaN/Sapphire Template Patterning", Semiconductor Science and Technology, vol. 27, 2012, pp. 1-5.
Ban et al., "Ir/Ag Reflector for High-Performance GaN-Based Near UV Light Emitting Diodes", Materials Science and Engineering B, vol. 133, 2006, pp. 26-29.
Cheng et al., "Light Output Enhancement of UV Light-Emitting Diodes with Embedded Distributed Bragg Reflector", IEEE Photonics Technology Letters, vol. 23, No. 10, May 15, 2011, pp. 642-644.
Cheong et al., "Structural and Optical Properties of Near-UV LEDs Grown on V-Grooved Sapphire Substrates Fabricated by Wet Etching", Journal of Crystal Growth, vol. 298, 2007, pp. 699-702.
Chiu et al., "Efficiency Enhancement of UV/blue Light Emitting Diodes Via Nanoscaled Epitaxial Lateral Overgrowth of GaN on a SiO2 Nanorod-Array Patterned Sapphire Substrate", Journal of Crystal Growth, vol. 310, 2008, pp. 5170-5174.
Takehara et al., "Indium-Tin Oxide/Al Reflective Electrodes for Ultraviolet Light-Emitting Diodes", Japanese Journal of Applied Physics, vol. 51, 2012, p. 042101 (4 pages).
Wierer, Jr., Jonathan J., "Light Extraction Methods in Light-Emitting Diodes", Optical Society of America/CLEO, 2011, 2 pages.
Zhmakin, A I., "Enhancement of Light Extraction from Light Emitting Diodes", Physics Reports, vol. 498, 2011, pp. 189-241.
Dong et al., "Ultraviolet Electroluminescence from Ordered ZnO Nanorod Arrayl/p-GaN Light Emitting Diodes", Applied Physics Letters, vol. 100, 2012, pp. 171109-1-171109-4.
Kasugai et al., "High-Efficiency Nitride-Based Light-Emitting Diodes with Moth-Eye Structure", Japanese Journal of Applied Physics, vol. 44, No. 10, 2005, pp. 7414-7417.
Gutt et al., "AlGaN-Based 355 nm UV Light-Emitting Diodes with High Power Efficiency", Applied Physics Express, vol. 5, 2012, p. 032101 (3 pages).
Hong et al., "Enhanced Light Output of GaN-Based Near-UV Light Emitting Diodes by Using Nanopatterned Indium Tin Oxide electrodes", Semiconductor Science and Technology, vol. 21, 2006, pp. 594-597.
Hong et al., "Fabrication of Moth-Eye Structure on p-GaN-Based LEDs for Improvement of Light Extraction", Materials Science and Engineering B, vol. 163, 2009, pp. 170-173.
Hsu et al., "Optimizing Textured Structures Possessing Both Optical Gradient and Diffraction Properties to Increase the Extraction Efficiency of Light-Emitting Diodes", Photonics and Nanostructures—Fundamentals and Applications, 2012, pp. 1-11.
Inazu et al., "Improvement of Light Extraction Efficiency for AlGaN-Based Deep Ultraviolet Light-Emitting Diodes", Japanese Journal of Applied Physics, vol. 50, 2011, p. 122101 (3 pages).
Iwaya et al., "Improvement of Light Extraction Efficiency of UV-LED Grown on Low-Dislocation-Density AlGaN", Phys. Stat. Sol. (a), vol. 200, No. 1, 2003, pp. 110-113.
Jeong et al., "InGaN/AlGaN Ultraviolet Light-Emitting Diode with a Ti3O5/Al2O3 Distributed Bragg Reflector", Japanese Journal of Applied Physics, vol. 47, No. 12, 2008, pp. 8811-8814.
Shatalov et al., "AlGaN Deep-Ultraviolet Light-Emitting Diodes with External Quantum Efficiency above 10%", Applied Physics Express, vol. 5, 2012, pp. 082101(3 pages).
Kim et al., "Enhancement of Light Extraction Efficiency of Ultraviolet Light Emitting Diodes by Patterning of Sio2 Nanosphere Arrays", Thin Solid Films, vol. 517, 2009, pp. 2742-2744.
Lee et al., "Light Extraction Analysis of GaN-Based Light-Emitting Diodes with Surface Texture and/or Patterned Substrate", Optics Express, vol. 15, No. 11, 2007, pp. 6670-6676.
Lobo et al., "Enhancement of Light Extraction in Ultraviolet Light-Emitting Diodes using Nanopixel Contact Design with Al Reflector", Applied Physics Letters, vol. 96, 2010, pp. 081109-1-081109-3.
Maier et al., "Enhancement of (AlGaIn)N near-UV LED Efficiency Using Freestanding GaN Substrate", Physica Status Solidi (c), vol. 5, No. 6, 2008, pp. 2133-2135.
Nishida et al., "340-350 nm GaN-free UV-LEDs", Physica Status Solidi (a), vol. 200, No. 1, 2003, pp. 106-109.
Park et al., "Study on Photoluminescence of Gan-Based UV-Leds with Refractive Index Gradient Polymeric Nanopatterns", Journal of Crystal Growth, vol. 326, 2011, pp. 28-32.
Pernot et al., "Improved Efficiency of 255-280nm AlGaN-Based Light-Emitting Diodes", Applied Physics Express, vol. 3, 2010, p. 061004 (3 pages).
Seo et al., "Enhanced Light Output Power of Near UV Light Emitting Diodes with Graphene / Indium Tin Oxide Nanodot Nodes for Transparent and Current Spreading Electrode", Optics Express, vol. 19, No. 23, Nov. 7, 2011, pp. 23111-23117.
Shakya et al., "III-Nitride Blue and UV Photonic Crystal Light-Emitting Diodes", Fourth International Conference on Solid State Lighting, Proc. of SPIE, vol. 5530, pp. 241-250.
Examination Report Received for Japanese Patent Application No. 2008-543389 mailed on May 22, 2012, 13 pages (6 pages of English Translation & 7 pages of Official copy).
PCT International Patent Application No. PCT/US2006/022329, International Search Report and Written Opinion mailed Dec. 12, 2006, 10 pages.
Arulkumaran et al., "Improved dc characteristics of AlGaN/GaN high-electron-mobility transistors on AlN/sapphire templates," 81 Applied Physics Letter 6, pp. 1131-1133 (2002).
Balkas et al., "Sublimation Growth and Characteristics of Bulk Aluminum Nitride Single Cyrstals," J. Crystal Growth 179, p. 363 (1997).
Barin Thermochemical Data of Pure Substances, 2nd Ed., pp. 42, 1334-1335, 1337, 1381-1382, 1636-1639 (1993).
Blckermann et al., "Characterization of Bulk AlN with Low Oxygen Content," J. Crystal Growth 269, Nos. 2-4, pp. 432-442.
Bockowski et al., "Combustion Synthesis of Aluminum Nitride Under High Pressure of Nitrogen and Nitrogen-Argon Mixtures," 5 J. Mat. Synthesis & Processing 6, pp. 449-458 (1997).
Bolgar et al., "Vaporization of the Nitrides of B, Al, and Ga," in Khim. Fiz. Nitridov, pp. 151-156 (1968) [Chem. Abstr. 71, 34003] (1969)].
Chase, J. Phys. Chem. Ref. Data 14, Supplement No. 1 (1985).
Chase, J. Phys. Chem., Ref. Data, Monograph No. 9, NIST-JANAF Thermochemical Tables, 4th Ed. (1998).
Chitnis et al., "Milliwatt Power AlGaN Quantum Well Deep Ultraviolet Light Emitting Diodes," Phys. Sat. Sol. (a) 200, No. 1, pp. 99-101 (2003).
Constantin et al., "Mixing rocksalt and wurtzite structure binary nitrides to form novel temary alloys; ScGaN and MnGaN," Mat. Res. Soc. Symp. Proc., 799 (2004) Z9.5.1.

(56) References Cited

OTHER PUBLICATIONS

Cox et al., "On the Preparation, Optical Properties and Electrical Behaviour of Aluminum Nitride," J. Phys. Chem. Solids, v. 28, pp. 543-548 (1967).
Dalmau et al., Mat. Res. Soc. Proc., v. 798, p. Y.2.9.1 (2004).
DeVries et al., "Phase equilibria pertinent to the growth of cubic boron nitried," J. Cryst. Growth, 13/14 (1972) 88.
Dryburgh, "The Estimation of Maximum Growth Rate for Aluminum Nitride Crystals by Direct Sublimation," J. Crystal Growth, 125, pp. 65-68 (1992).
Dugger, "The single crystal synthesis and some properties of Aluminum Nitride", Air Force Cambride Research Laboratories, Physical Science Research Papers, No. 656 (Aug. 1, 1975).
Dugger, "The synthesis of Aluminum Nitride single crystals", Mat. Res. Bulletin. 9 (1974) 331.
Epelbaum et al., "Sublimation growth of bulk AlN crystals: materials compatibility and crystal quality," Mat Sci. Forum (2002)389-393. 1445.
Gorbatov et al., "Electrical Conductivity of Materials from Mixed Aluminum and Silicon Nitrides,"Sov. Powd. Met. Met. Ceram., v. 9, pp. 917-920 (1970).
Hacke et al., "Photoluminescence Intensity and Spectral Distribution of GaN Films on SiC," Phys. Stat. Sol. (b) 216, 639 (1999).
Hermann et al., "Highly Si-doped AlN Grown by Plasma-Assisted Molecular-Beam Epitaxy," Applied Phys. Letters, v. 86, pp. 192108-1-192108-3 (2005).
Honig, "Vapor Pressure Data for the Solid and Liquid Elements", RCA Review, vol. 23, (1962) 567.
IPRP and WO for PCT/US2006/022329.
IPRP and WO for PCT/US2006/045540, mailed Jun. 12, 2008.
IPRP and WO for PCT/US2006/046300, mailed Jun. 12, 2008.
IPRP and WO for PCT/US2007/011075 mailed Nov. 20, 2008.
ISR and WO for PCT/US2007/011075 mailed Jul. 11, 2008.
ISR and WO for PCT/US2007/07980, dated Oct. 12, 2007.
ISR and WO for PCT/US2008/000597, mailed May 20, 2008.
ISR and WO for PCT/US2008/001003, mailed Aug. 5, 2008.
ISR for PCT/US2006/022329, mailed Dec. 12, 2006.
ISR for PCT/US2006/045540, mailed Jul. 6, 2007.
ISR for PCT/US2006/046300, mailed May 30, 2007, 4 pages.
Jahnen et al., "Pinholes, Dislocations and Strain Relaxation in InGaN," MRS Internet J. Nitride Semicond. Res., 3:39 (1998).
Kanechika et al., "n-type AlN Layer by Si Ion Implantation," Applied Phys. Letter, v. 88, p. 202106 (2006).
Karel et al., "The luminescence properties of AlN with Manganese and rare earth activators under ultraviolet and cathode-ray excitation", Czech. J. Phys., B20 (1970) 46.
Karpinski et al.., "Equilibrium pressure of N2 over GaN and high pressure solution growht of GaN", J. Cryst. Growth, 66 (1984) 1.
Karpov et al., "Sublimation Growth of AlN in Vacuum and in a Gas Atmosphere," Phys. Stat. Sol. (a) 176, p. 436 (1999).
Kasu et al., "Formation of Solid Solution of $Al_{1-x}Si_xN$ ($0>x\leq12\%$) Temary Alloy," Jap. J. Appl. Phys., v. 40, part 2, No. 10A, pp. L1048-L1050 (2001).
Kawabe et al., "Electrical and Optical Properties of AlN-a Thermostable Semiconductor," Elec. Engin. In Japan, v. 87, pp. 62-70 (1967).
Khan "AlGaN Bases Deep Ultraviolet Light Emitting Diodes with Emission from 250-280 nm." abstract and presentation at the Int'l. Workshop on Nitride Semicond., Pittsburg, PA, Jul. 19, 2004.
Kordis, "The Be—O—MgO system", J. Nuc. Mater., 14 (1964) 322.
Lawson et al., "Preparation of Single Crystals", Academic Press, New York (1958) pp. 18-20.
Liu et al., "A Global Growth Rate Model for Aluminum Nitride Sublimation," J. Electrochemical Soc. 149, p. G12 (2002).
Liu et al., "Characterization of AlN Crystals Grown by Sublimation," Phys. Stat. Sol. (a) 188, p. 769 (2001).
Liu et al., "Misfit Dislocation Generation in InGaN Epilayers on Free-Standing GaN," Jap. J. Appl. Physcis, 46:22, pp. L549-L551 (2006).
Ludwig et al., "Dimers [Al2N4]", Zeitsch. F. Naturforsch, B54 (1999) pp. 461-465.
Matthews et al., "Defects in Epitaxial Multilayers," J. Crystal Growth 27, p. 118 (1974).
Mokhov et al., "Sublimation growth of AlN bulk crystals in Ta crucibles," Jrl. of Cryst. Growth, (Jul. 15, 2005) vol. 281, No. 1, pp. 93-100.
Naidu et al., Eds. "Phase Diagrams of Binary Tungsten Alloys," Indian Institute of Metals, Calcutta, pp. 7-13 (1991).
Nakanishi et al., "Effects of Al Composition on luminescence properties of europim implanted AlxGa1-xN ($0>x>1$)", Phys. Stat. Sol. (c). 0 (2003). 2623.
Nassau et al., "The Physics and Chemistry of Color," Wiley-Interscience Publication (New York 1983).
Niewa et al., "Li3[ScN2]: The first nitridoscandate (III)—Tetrahedral Sc Coordination and unusual MX2 framework", Chem. Eur. J. 9 (2003) 4255.
Niewa et al., "Recent developments in nitride chemistry", Chem. Mater., 10(1998) 2733.
Noveski et al., "Growth of AlN Crystals on AlN/SiC Seeds by AlN Powder Sublimation in Nitrogen Atmosphere." MRS Internet J. Nitride Semicond. Res. 9, 2 (2004).
Noveski et al., "Mass Transfer in AlN Crystal Growth at High Temperatures," J. Crystal Growth 264, pp. 369-378 (2004).
Office Action in Europeans Patent Application No. 02806723.9, Aug. 8, 2003, 3 pages.
Office Action in Japanese Patent Application No. 2003-579324, May 27, 2008, 2 pages (translation).
Parker et al., "Determination of the critical layer thickness in the InGaN/GaN heterostructures," Applied Phys. Letters., 75:16, pp. 2776-2778 (1999).
Partial International Search Report for International Application No. PCT/US07/11075, daed May 7, 2008 (2 pages).
Proc. of NATO Advanced Study Inst. on Nitrogen Ceramics, University of Kent, Canterbury, U.K. (1976).
Raghothamachar et al., "Synchrotron White Beam Topography Characterization of Physical Vapor Transport Grown AlN and Ammonothermal GaN," J. Crystal Growth 246, pp. 271-280 (2002).
Raghothamachar et al., "X-ray Characterization of Bulk AlN Single Crystals Grown by the Sublimation Technique," J. Crystal Growth 250(1-2), pp. 244-250 (2003).
Rojo et al., "Growth and Characterization of Epitaxial Layers on Aluminum Nitride Substrates Prepared from Bulk, Single Crystals" J. Crystal Growth 240, p. 508 (2002).
Rojo et al., "Progress in the Preparation of Aluminum Nitride Substrates from Bulk Crystals," Mat. Res. Soc. Symp. Proc. 722, pp. 5-13 (2002).
Rojo et al., "Report on the Growth of Bulk Aluminum Nitride and Subsequent Substrate Preparation," J. Crystal Growth 231, p. 317 (2001).
Schlesser et al., "Growth of AlN Bulk Crystals from the Vapor Phase," Mat. Res. Soc. Symp. Proc. 693, p. 19.4.1 (2002).
Schlesser et al., "Seeded Growth of AlN Bulk Single Crystals by Sublimation," J. Crystal Growth 241, pp. 416-420 (2002).
Schowaiter et al., "Fabrication of Native, Single-Crystal AlN Substrates," Phys. Stat. Sol. (c), 1-4 (2003).
Segal et al., "On Mechanisms of Sublimination Growth of AlN bulk Crystals," J. Crystal Growth 211, pp. 68-72 (2000).
Shih et al., "High-quality and Crack-free AlxGa1-xN (x(0.2) grown on Sapphire by a two-step Growth Method," 277 J. Crystal Growth 1-4, pp. 44-50 (2005).
Silveira et al., "Excitonic Structure of Bulk AlN from Optical Reflectivity and Cathodoluminescense Measurements," Phys. Review B71, 041201™ (2006).
Singh et al., "Physical Vapor Transport Growth of Large AlN Crystals," J. Cryst. Growth 250, p. 107 (2003).
Slack et al., "AlN Single Crystals," J. Crystal Growth 42, pp. 560-563 (1977).
Slack et al., "Growth of High Purity AlN Crystals," J. Crystal Growth 34, pp. 263-279 (1976).
Slack et al., "Properties of Crucible Materials for Bulk Growth of AlN," Mat. Res. Soc. Proc., v. 798, p. Y10.74.1-Y10.74.4 (2004).

(56) References Cited

OTHER PUBLICATIONS

Slack et al., "Some Effects of Oxygen Impurities on AlN and GaN," J. Crystal Growth 246, pp. 287-298 (2002).
Smart et al., "AlGaN/GaN Heterostructures on Insulating AlGaN Nucleation Layers," Appl. Phys. Letters 75, p. 388 (1999).
Solid State Lighting Report (Dept. of Energy, 2007).
Song, "Strain relaxation due to V-pit formation in InxGa1-xN/GaN eplilayers grown on sapphire," J. Applied Phys. 98: 084906 (2005).
Sun et al., "Phase relationships in the system Y—Al—O—N", Mater. Letters, 3-4 (1991) 76.
Takeuchi et al., "Optical Properties of Strained AlGaN and GaInN on GaN," Jap. J. Appl. Phys., v. 36, pp. L177-L179 (1997).
Takeya et al., "Degradation in AlGaInN Lasers," Phys. Stat. Sol. (c) 0, No. 7, pp. 2292-2295 (2003).
Taniyasu et al., "An aluminum nitride light-emitting diode with wavelength of 210 nanometres", Nature, 441 (2006) 325.
Taniyasu et al., "Intentional control of n-type conduction for Si-doped AlN and AlxGa1-xN (0.42>x>1)", Applied Physics Letters, 81 (2002) 1255.
Tavemier et al., "Chemical Mechanical Polishing of Gallium Nitride," Electrochemical and Solid State Letters, v. 5(8), pp. G61-G64 (2002).
Tomiya et al., "Dislocaitons in GaN-Based Laser Diodes on Epi-taxial Lateral Overgrown GaN Layers," Phys. Stat. Sol. (a) 188, No. 1, pp. 69-72 (2001).
Tsao, "Solid-State Lighting: Lamps, Chips and Materials for Tomorrow," IEEE Circuits and Devices Magazines 20, p. 28 (2004).
Van de Walle et al., "Doping of AlGaN Alloys," MRS Internet J. Nitride Semicond. Res., 4S1, G10.4, pp. 1-12 (1999).
Van de Walle et al., "DX-center Formation in Wurtzite and Zinceblende AlxGa1-xN," Phys. Res. B57, R2033 (1998).
Vendi et al., "The melting points of some rare-earth nitrides as function of the nitrogen pressures", High Temperatures—High Pressures, 9 (1977) 313.
Venugopal et al., "Comparison of Various Buffer Schemes to Grow GaN on Large-Area Si(111) Substrates Using Metal-Organic Chemical Vapor Deposition," 32 J. Electronic Mat. 5, pp. 371-374 (2003).
Vinogradov, "Determination of the Melting Parameters of Aluminum Nitride," High Temperatures—High Pressures, v. 23, pp. 685-688 (1991).
Wentorf Jr., "Synthesis of the cubic form of boron nitride", J. Chem. Phys., 34 (1961) 809.
Yamane et al., "Preparation of GaN single crystals using a Na flux", Chem. Mater., 9 (1997) 413.
Yano et al., "Growth of nitride crystals, BN, AlN, and GaN by using a Na flux", Diamond and Related Materials, 9 (2000) 512.
Zeisel et al., "DX-behavior of Si in AlN," Phys. Rev. B61, R16283 (2000).
Zhuang et al., "Seeded growth of AlN single crystals by physical vapor transport," Jrl. of Crys. Growth. (Jan. 25, 2006) vol. 287, No. 2, pp. 372-375.
IPRP and WO for PCT/US2008/000597 mailed Jul. 30, 2009.
IPRP and WO for PCT/US2008/001003, mailed Aug. 6, 2009.
Katayama-Yoshida et al., "Codoping method for the Fabrication of Low-Resistivity Wide Band-Gap Semiconductors in p-type GaN, p-type AlN and n-type Diamond: Prediction versus Experiment," 13 J. of Physics: Condensed Matter, pp. 8901-8914 (2001).
Office Action in Australian Patent Application No. 2008303485, Oct. 9, 2008, 2 pages.
Office Action in Canadian Patent Application No. 2,467,806, Aug. 13, 2009, 4 pages.
Office Action in Canadian Patent Application No. 2,467,806, Feb. 23, 2010, 2 pages.
Office Action in European Patent Application No. 02803675.4, May 2, 2007, 4 pages.
Office Action in European Patent Application No. 02806723.9, dated Feb. 16, 2010, (2 pages).
Office Action in European Patent Application No. 02806723.9, Feb. 7, 2007, 4 pages.
Office Action in European Patent Application No. 02806723.9, Jan. 17, 2008, 4 pages.
Office Action in European Patent Application No. 03808366.3, dated Sep. 28, 2006, 4 pages.
Office Action in European Patent Application No. 06844804.2, Mar. 4, 2009, 3 pages.
Office Action in Japanese Patent Application No. 2003-545445, mailed Nov. 10, 2009, 3 pages (translation).
Office Action in Japanese Patent Application No. 2003-545445, mailed Sep. 30, 2008, 3 pages (translation).
Office Action in Japanese Patent Application No. 2003-579324, Sep. 8, 2009, 1 page (translation).
Office Action in Japanese Patent Application No. 2004-564648, Feb. 3, 20110, 2 pages (translation).
Office Action in Japanese Patent Application No. 2004-564648, Jun. 24, 2009, 2 pages (translation).
Office Action in Taiwan Patent Application No. 91137050, Apr. 6, 2004, 1 page (translation).
Summons to Attend Oral Proceedings in Europeans Patent Application No. 03808366.3, Dec. 17, 2007, 5 pages.
Wongchotigul et al., "Low Resistivity Aluminum Nitride:Carbon (AlN:C) Films Grown by Metal Organic Chemical Vapor Deposition," 26 Materials Letters, pp. 223-226 (Mar. 1996).
Atobe—JJAP, 29, 150, 1990—F-Type Centers in Neutron-Irradiated AlN.
Berzina-RadEFF 157, 1089, 2002—Luminescence mechanisms of O-related defects in AlN.
Bickermann et al., "Point Defect Content and Optical Transitions in Bulk Aluminum Nitride Crystals," Phys. Stat. Sol. B 246, No. 6, pp. 1181-1183 (2009).
Bickerman pssc 0, 1993-1996, 2003—PVT growth of bullk AlN.
Bickermann—APL, 103,073522, 2008—Polarization dependent below BG optical absorption of AlN bulk crystals.
Bradley—JVacSciTechB 21, 2558, 2003—Deep level defects and doping in high Al mole fraction AlGaN.
Brunner—JAppPhys 82, 5090, 1997—Optical constants of epitacial AlGaN films and their temperature dependence.
Collins—PRB 158, 833, 1967—Lattice vibration spectra of AlN.
Edgar—JCrGrwth 310, 4002, 2008—Native oxide and hydroxides and their implications for bulk AlN crystal growth.
Evans—APL 88, 06112, 2006—EPR of a donor in AlN crystals.
Freitas—pssb 240, 330, 2003—Shallow donors in GaN.
Freitas—APL 83, 2584,2003—Properties of bulk AlN grown by thermodecomposition of AlCl3—NH3.
Freitas—JCrGrwth 281, 168, 2005—Optical studies of bulk and homoepitaxial films of III-V nitride semiconductors.
Gutierrez—Phil.Mag.Let. 79, 147, 1999—The formation of nanopipes caused by donor impurities in GaN; a theoretical study for the case of oxygen.
Honda—JJAP 29, L652, 1990—Electron paramagnetic center in neutron-irradiated AlN.
Hossain—SPIE 2877, 42, 1996—Study of CL spectroscopy of AlN.
Jones—JMR 14, 4344, 1999—Optical properties of AlN from VUS and ellopsometry.
Kazan-Diamond15, 1525, 2006—Phonon dynamics in AlN lattice contaminated by O.
Kazan—JAP, 98, 103529,2005—Oxygen behavior in AlN.
Klemens—PhysB, 316-317,413, 2002—Effect of point defects on the decay of the longitudinal optical mode.
Kovalenkov—JCrGrwth 28187, 2005—Thick AlN layers grown by HVPE.
Mason—PRB 59, 1937, 1999—Optically detected EPR of AlN single crystals.
McCluskey—PRL 80 4008 1998—Metastability of oxygen donors in AlGaN.
Meyer—Mat.Scie.EngB71,69,2000—Defects and defect identication in group III-nitrides.
Morita—JJAP 21, 1102, 1982—Optical absorption and CL of epitaxial AlN films.
Nakahata—JAmCerSoc 80, 1612, 1997—Electron spin resonance analysis of lattice defects in poly AlN.
Nakarmi—APL 94, 091903, 2009—PL studies of impurity transitions Mg-doped AlGaN alloys.

(56) References Cited

OTHER PUBLICATIONS

Nam—APL 86, 222108, 2005—Deep impurity transitions involving cation vacancies and complexes in AlGaN alloys.
Nepai—APL 84, 1091, 2004—Optical properties of the nitrogen vacancyin AlN epilayers.
Nepai—APL 89, 092107, 2006—Photoluminescence studies of impurity transitions in AlGaN alloys.
Pantha—APL 91, 121117, 2007—Correlation between biaxial stress and free exciton transition in AlN.
Perry and Rutz—APl 33, p. 319, 1978—The optical absorption edge of single-crystal AlN prepared by a closed-spaced vapor process.
Salzman—pssc 0, 2541, 2003—Reduction of oxygen contamination in AlN.
Sarua—MRS 798, Y17.1, 2004—Effect of impurities on Raman and PL spectra of AlN bulk crystals.
Schlesser—JCrGrwth 281, 75, 2005—Crucible materials for growth of aluminum nitride crystals.
Schweizer—ppsb 219, 171, 2000—Investigation of oxygen-related luminescence centres in AlN ceramic.
Sedhain—APL 93, 014905, 2008—Photoluminescence properties of AlN homeopilayers with different orientations.
Shi—APL89, 163127, 2006—Luminescence properties of AlN nanotips.
Stampfl—PRB 65, 155212, 2002—Theoretical investigation of native defects, impurities and complexes in aluminum nitride.
Strassburg—JAP 96, 5870,2004—Growth and optical properties of large high quality AlN single crystals.
Thomas—J.Eur.Cer.Soc. 1991—Determination of the concentration of oxygen dissolved in the AlN lattice.
Trinkler—JphysCondMatt 13, 8931, 2001—Radiation induced recombination processes in AlN ceramics.
Trinkler—RadiationMeasurements 33, 731, 2001—Stimulated luminescence of AlN ceramics induced by UV radiation.
Trinkler—SPIE 2967, 85, 1997—Spectral properties of AlN ceramics.
Tuomisto—JCrGrwth 2008—Characterization of bulk AlN crystals with position annihilation spectroscopy.
Vail—JPhysCondMat18,21225, 2006—The nitrogen vacancy in AlN.
Van de Walle—AppPhysRev 95,3852 2004—First principles calculations for defects and impurities—Application s to iii-nitrides.
Watanabe—JMR13,2956,1998—Changes in optical transmittance and surface morphology of AlN thin films exposed to atmosphere.
Gaska et al., "Deep-Ultraviolet Emission of AlGaN/AlN Quantum Wells on Bulk AlN," Applied Physics Letters, vol. 81, No. 24, pp. 4658-4660 (Dec. 9, 2002).
Office Action in Chinese Patent Application No. 200680045153.1, Oct. 13, 2010, 4 pages (translation).
Office Action in Chinese Patent Application No. 200780018103.9, Apr. 6, 2011, 6 pages (translation).
Epelbaum et al., "Natural Growth Habit of Bulk AlN Crystals," Journal of Crystal Growth, vol. 265, No. 3-4, pp. 577-581 (May 2004).
Bennett et al., "High Quality InGaAs/InP and InAlAs/InP Heterostructures Beyond the Matthew-Blakeslee Critical Layer Thickness," 4th Annual conference on InP and Related materials, Newport, RI, pp. 650-653 (Apr. 1992).
International Search Report and Written Opinion mailed Sep. 19, 2011 for International Application No. PCT/US2011/042571 (14 pages).
Office Action mailed May 15, 2012 for Japanese Patent Application No. 2008-543541.
Office Action mailed May 22, 2012 for Japaneses Patent Application No. 2008-543389.
Office Action in Chinese Patent Application No. 200680045153.1, Jun. 4, 2012, 7 pages (translation).
U.S. Appl. No. 11/633,667, filed Dec. 4, 2006, by Schowalter et al.; the Office Actions mailed Oct. 7, 2008 and May 13, 2009; and the Notice of Allowance mailed Aug. 27, 2009.
U.S. Appl. No. 12/642,182, filed Dec. 18, 2009, by Schowalter et al.; the Office Actions mailed Aug. 2, 2013 and Dec. 9, 2013; and the Notice of Allowance mailed Mar. 17, 2014.
U.S. Appl. No. 11/265,909, filed Nov. 13, 2005, by Showalter et al.; Non Final Office Action mailed Dec. 27, 2007; Non-Final Office Action mailed Jan. 12, 2009; Final Office Action mailed Jul. 28, 2009; Advisory Action Mailed Sep. 25, 2009; Advisory Action mailed Oct. 21, 2009 and Notice of Allowance mailed Apr. 7, 2010.
U.S. Appl. No. 10/324,998, filed Dec. 20, 2002, by Schowalter et al.; Non-Final Office Action mailed Nov. 26, 2003 and Notice of Allowance mailed Mar. 15, 2004.
U.S. Appl. No. 10/725,869, filed Dec. 2, 2003, by Rojo et al.; Notice of Allowance mailed Apr. 12, 2006.
U.S. Appl. No. 10/910,162, filed Aug. 3, 2004, by Schowalter et al.; Non-Final Office Action mailed Jan. 10, 2008; Non-Final Office Action mailed Mar. 24, 2006; Non-Final Office Action mailed May 15, 2007; Final Office Action mailed Aug. 1, 2006; Final Office Action mailed Oct. 31, 2007 and Final Office Action mailed Mar. 9, 2009.
U.S. Appl. No. 11/431,090, filed May 9, 2006, by Schowalter et al.; Non-Final Office Action mailed Apr. 1, 2008; Final Office Action mailed Feb. 5, 2009; Advisory Action mailed Apr. 21, 2009; Final Office Action mailed Jul. 23, 2009; Advisory Action mailed Oct. 2, 2009 and Notice of Allowance mailed Jun. 3, 2013.
U.S. Appl. No. 11/503,660, filed Aug. 14, 2006, by Schowalter et al.; Non-Final Office Action mailed Aug. 21, 2008; Final Office Action mailed Apr. 3, 2009 and Notice of Allowance mailed Aug. 12, 2009.
U.S. Appl. No. 11/605,192, filed Nov. 28, 2006, by Bondokov et al.; Non-Final Office Action mailed May 14, 2008; Non-Final Office Action mailed Dec. 29, 2008; Final Office Action mailed Aug. 21, 2009; Notice of Allowance mailed Sep. 7, 2012 and Notice of Allowance mailed Sep. 18, 2012.
U.S. Appl. No. 11/731,790, filed Mar. 30, 2007, by Morgan et al.; Non-Final Office Action mailed Oct. 14, 2010; Non-Final Office Action mailed Dec. 14, 2009 and Notice of Allowance mailed May 12, 2011.
U.S. Appl. No. 12/015,957, filed Jan. 17, 2008, by Bondokov et al.; Non-Final Office Action mailed Feb. 29, 2012 and Notice of Allowance mailed Aug. 1, 2012.
U.S. Appl. No. 12/020,006, filed Jan. 25, 2008, by Schowalter et al.; Non-Final Office Action mailed May 10, 2010; Non-Final Office Action mailed Nov. 25, 2011; Final Office Action mailed Aug. 3, 2012; and Final Office Action mailed Oct. 22, 2010.
U.S. Appl. No. 12/617,150, filed Nov. 12, 2009, by Schowalter et al.; Non-Final Office Action mailed Jul. 13, 2011 and Notice of Allowance mailed Mar. 12, 2012.
U.S. Appl. No. 12/764,584, filed Apr. 21, 2010, by Grandusky et al.; Non-Final Office Action mailed Jan. 27, 2011 and Notice of Allowance mailed Aug. 18, 2011.
U.S. Appl. No. 12/827,507, filed Jun. 30, 2010, by Schujman et al.; Non-Final Office Action mailed Nov. 6, 2013; Non-Final Office Action mailed Jul. 16, 2014; and Notice of Allowance mailed Jan. 16, 2015.
U.S. Appl. No. 12/841,350, filed Jul. 22, 2010, by Schowalter et al.; Non-Final Office Action mailed May 24, 2011 and Notice of Allowance mailed Oct. 27, 2011.
U.S. Appl. No. 13/173,213, filed Jun. 30, 2011, by Bondokov et al.; Non-Final Office Action mailed Aug. 6, 2014 and Notice of Allowance mailed Jan. 14, 2015.
U.S. Appl. No. 13/298,570, filed Nov. 17, 2011, by Grandusky et al., Non-Final Office Action mailed May 14, 2014; Final Office Action mailed Nov. 19, 2014 and Non-Final Office Action mailed Apr. 21, 2015.
U.S. Appl. No. 13/553,093, filed Jul. 19, 2012, by Schowalter et al., Notice of Allowance mailed Oct. 14, 2014.
U.S. Appl. No. 13/669,630, filed Nov. 6, 2012, by Bondokov et al.; Non-Final Office Action mailed Dec. 20, 2013 and Notice of Allowance mailed May 19, 2014.
U.S. Appl. No. 13/706,966, filed Dec. 6, 2012, by Bondokov et al.; Non-Final Office Action mailed Apr. 1, 2013 and Notice of Allowance mailed Jul. 18, 2013.

(56) References Cited

OTHER PUBLICATIONS

U.S. Appl. No. 13/974,710, filed Aug. 23, 2013, by Schwalter et al.; Notice of Allowance mailed Jul. 22, 2014.
U.S. Appl. No. 14/208,379, filed Mar. 13, 2014, by Grandusky et al.; Non-Final Office Action mailed Jan. 16, 2015.
U.S. Appl. No. 14/596,806, filed Jan. 14, 2015, by Leo J. Schowalter et al.
U.S. Appl. No. 14/458,825, filed Aug. 13, 2014, by Bondokov et al.
U.S. Appl. No. 14/458,861, filed Aug. 13, 2014, by Bondokov et al.
U.S. Appl. No. 14/520,615, filed Oct. 22, 2014, by Schowalter et al.
U.S. Appl. No. 14/208,089, filed Mar. 13, 2014, by Grandusky et al.
U.S. Appl. No. 14/051,566, filed Oct. 11, 2013, by Robert Bondokov et al.
U.S. Appl. No. 14/684,754, filed Apr. 13, 2015, by Bondokov et al.
U.S. Appl. No. 14/686,812, filed Apr. 15, 2015, by Bondokov et al.

DOPED ALUMINUM NITRIDE CRYSTALS AND METHODS OF MAKING THEM

CROSS-REFERENCE TO RELATED APPLICATIONS

The present application is a continuation of U.S. patent application Ser. No. 12/642,182, filed Dec. 18, 2009, which is a continuation of U.S. patent application Ser. No. 11/633,667, filed Dec. 4, 2006, which claims the benefits of and priority to U.S. Provisional Application Ser. No. 60/741,701, filed on Dec. 2, 2005, the entire disclosures of which are hereby incorporated by reference.

GOVERNMENT SUPPORT

This invention was made with United States Government support under 70NANB4H3051 awarded by the National Institute of Standards and Technology (NIST). The United States Government has certain rights in the invention.

BACKGROUND

Semiconductor materials exhibit controllable optical and electrical properties, such as conductivity, over a wide range. Such control is enabled by use of dopants, which are impurities introduced into the crystalline lattice of the semiconductor material to serve as sources of electrons (negative charges) or holes (positive charges). Controllable doping enables the fabrication of a wide range of semiconductor devices, e.g., light-emitting diodes (LEDs), lasers, and transistors.

Nitride-based semiconductors such as gallium nitride (GaN) and aluminum nitride (AlN) are of great interest technologically, in part because of their wide bandgaps. Controllable and repeatable doping of these materials enables the fabrication of light-emitting devices, such as LEDs and lasers, that emit light at short wavelengths, i.e., at blue, violet, and even ultraviolet wavelengths. Moreover, n- and p-type nitrides can be utilized in the fabrication of transistors suited for high power and/or high temperature applications. In an n-type semiconductor, the concentration of electrons is much higher then the concentration of holes; accordingly, electrons are majority carriers and dominate conductivity. In a p-type semiconductor, by contrast, holes dominate conductivity.

Making p-type nitride semiconductor materials can be difficult generally, and obtaining conductive crystals or epitaxial layers of p-type aluminum nitride (AlN), or of $Al_xGa_{1-x}N$ alloys with high Al content, has posed particular challenges. Adding carbon and oxygen to AlN causes it to turn blue, which means it absorbs in the red (unlike more typical AlN, grown without added impurities, which tends to absorb in the blue due to N vacancies). Some conductivity measurements have suggested that the blue crystal is p-type while other work has cast doubt on the possibility of making p-type AlN at all. The acceptor levels from most substitutional dopants in AlN will tend to be rather deep in the energy bandgap, making it difficult to achieve reasonable conductivity levels unless high concentrations of the dopant are used. Unfortunately, the solubility of a single p-type impurity atom tends to be rather low, and tendency of the crystal to form charge compensating vacancy defects will be high.

In any case, the only p-type AlN materials produced to date have involved small crystals, only a few millimeters (mm) in size, grown in the laboratory. N-type doping of nitride materials also presents difficulties. Thus, success in creating large, conductive crystals has proven elusive.

DESCRIPTION OF THE INVENTION

Brief Summary of the Invention

The present invention facilitates formation of large-scale (e.g., in some embodiments, having diameters of at least 1 cm) doped AlN crystals. The dopants may be n-type and/or p-type, and following electrical activation, the crystal will exhibit sufficient conductivity and/or mobility characteristics to support formation of commercial devices.

In accordance with the present invention, an acceptor level is created within the perfect, stoichiometric AlN or AlGaN lattice by introducing a substitutional impurity that has one fewer electron than aluminum (Al) or nitrogen (N). Charge-compensating defects such as vacancies on the N anion site (designated as $V_N$) or impurities with an extra electron are desirably avoided but, more generally, are either reduced in density or less active. In order to use atoms that have nearly the same diameter as Al or N and avoid local strain, dopants are preferably selected from the upper part of the periodic table. Choices for the Al site include beryllium (Be), magnesium (Mg), and zinc (Zn) while carbon (C) is one choice for the N site. Dopants such as lithium (Li) with two fewer electrons than Al may also be used to make p-type AlN and AlGaN.

The p-type doping of AlN and AlGaN may be accomplished by the introduction of a single substitutional impurity such as Be, Mg, Zn, Li or C into the AlN lattice. This general method is called mono-doping. It is typically followed by a treatment of the crystal to electrically activate the impurity species.

Accordingly, in a first aspect, the invention features a method of forming a doped AlN crystal including forming a mixed crystal containing AlN and a plurality of impurity species, and electrically activating at least one impurity species in at least a portion of the mixed crystal. In an embodiment, the mixed crystal is sliced into a plurality of wafers prior to the step of electrically activating. After the step of electrically activating, the doped AlN crystal may have a conductivity greater than approximately $10^{-5}$ $\Omega^{-1}$ $cm^{-1}$, or even greater than approximately $3 \times 10^{-3}$ $\Omega^{-1}$ $cm^{-1}$, and/or a mobility greater than approximately 25 $cm^2$ $V^{-1}$ $s^{-1}$ at room temperature.

Embodiments of the invention may include one or more of the following features. Prior to electrical activation, the mixed crystal may have a conductivity less than approximately $10^{-2}$ $\Omega^{-1}$ $cm^{-1}$ at room temperature, and after electrical activation, the doped AlN crystal may be n-type or p-type. The plurality of impurity species may include a substitutional dopant, for example, C, O, Be, Mg, Zn, or Si. The plurality of impurity species may include an interstitial dopant, for example, Li, and the step of electrically activating may include at least one of annealing, immersing in molten metal, or applying a voltage to at least a portion of the mixed crystal. Such a step may result in the extraction of the interstitial dopant from at least a portion of the mixed crystal.

The plurality of impurity species may include at least one donor and at least one acceptor. In an embodiment, the at least one donor and the at least one acceptor occupy a cation lattice site. The at least one donor includes Si and the at least one acceptor includes Be, Mg, or Zn. In another embodiment, the at least one donor and the at least one acceptor occupy an anion lattice site. The at least one donor includes O and the at least one acceptor includes C. In various embodiments, the step of electrically activating includes annealing.

In another aspect, the invention features a method of forming a p-type AlN crystal including forming a mixed crystal containing AlN and a source of substitutional impurities, and electrically activating at least some of the substitutional impurities.

Embodiments of the invention may include one or more of the following features. The source of substitutional impurities may include $Be_3N_2$. The step of electrically activating at least a portion of the substitutional impurities may include converting $Be_3N_2$ to $Be_3N_3$, and may include subjecting the mixed crystal to a pressure of less than approximately 100 MPa and a temperature of less than approximately 2300° C. in a nitrogen ambient. Alternatively or in addition, the source of substitutional impurities may include at least one of $Mg_3N_2$, $Zn_3N_2$, $Li_3N$, BeO, $BeSiN_2$, LiBeN, $Be_2C$, $MgSiN_2$, $LiSi_2N_3$, LiMgN, or LiZnN.

In still another aspect, the invention features a doped AlN crystal with a thickness at least approximately 0.1 mm, a diameter at least approximately 1 cm, and a conductivity greater than approximately $10^{-5}$ $\Omega^{-1}$ $cm^{-1}$ at room temperature. The conductivity may be greater than approximately $3\times10^{-3}$ $\Omega^{-1}$ $cm^{-1}$ at room temperature. The AlN crystal may have a mobility greater than approximately 25 $cm^2$ $V^{-1}$ $s^{-1}$ at room temperature. The diameter may be at least approximately 2 cm. The AlN crystal may include at least two substitutional dopants selected from the group consisting of C, O, Be, Mg, Zn, and Si.

In yet another aspect, the invention features a doped, p-type AlN crystal with a mobility greater than approximately 25 $cm^2$ $V^{-1}$ $s^{-1}$ at room temperature. The AlN crystal may include at least at least two substitutional dopants selected from the group consisting of C, O, Be, Mg, Zn, and Si.

Another aspect of the invention features a doped, n-type single-crystal AlN structure with a thickness of at least approximately 0.1 mm and a diameter of at least approximately 1 cm. The mobility of the AlN structure may be greater than approximately 25 $cm^2$ $V^{-1}$ $s^{-1}$ at room temperature. The AlN crystal may include at least two substitutional dopants selected from the group consisting of C, O, Be, Mg, Zn, and Si.

In another aspect, the invention features a doped, single-crystal AlN structure with the dimensions of at least 2 mm by 2 mm by 1 mm and a conductivity greater than approximately $10^{-5}$ $\Omega^{-1}$ $cm^{-1}$ at room temperature. The AlN crystal may include at least two substitutional dopants selected from the group consisting of C, O, Be, Mg, Zn, and Si.

In another aspect, the invention features a doped, p-type AlGaN epitaxial layer having an Al concentration greater than approximately 50% and a conductivity greater than approximately $10^{-5}$ $\Omega^{-1}$ $cm^{-1}$ at room temperature. The conductivity may be greater than approximately $3\times10^{-3}$ $\Omega^{-1}$ $cm^{-1}$ at room temperature. The epitaxial layer may have a mobility greater than approximately 25 $cm^2$ $V^{-1}$ $s^{-1}$ at room temperature. In an embodiment, the epitaxial layer includes at least two substitutional dopants selected from the group consisting of C, O, Be, Mg, Zn, and Si.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE PREFERRED EMBODIMENTS

Figure 1:
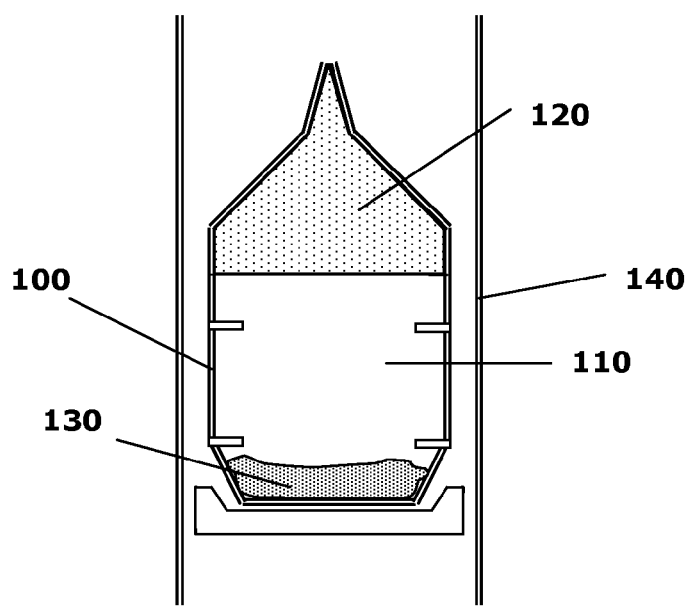
FIG. 1 schematically depicts a crystal growth enclosure for the growth of single-crystalline AlN.

Referring to FIG. 1, AlN crystals can be formed by the sublimation-recondensation method as described in U.S. Pat. No. 6,770,135, the entire disclosure of which is herein incorporated by reference. Crystal growth enclosure 100 includes a vapor mixture 110, an AlN crystal 120, and polycrystalline source 130, and is surrounded by furnace 140. In an embodiment, crystal growth enclosure 100 includes tungsten. In alternative embodiments, crystal growth enclosure 100 includes a tungsten-rhenium alloy, rhenium, carbon, tantalum carbide, tantalum nitride, tantalum carbo-nitride, hafnium nitride, mixtures of tungsten and tantalum, or a combination thereof, as described in U.S. patent application Ser. No. 10/822,336, the entire disclosure of which is herein incorporated by reference.

Vapor mixture 110 arises from the heating of polycrystalline source 130 at one end of crystal growth enclosure 100, and coalesces into AlN crystal 120 at another, cooler end. AlN crystal 120 may include finite concentrations of interstitial or substitutional impurities. Upon further treatment, the impurities can be electrically activated to dope AlN crystal 120 and provide it with desirable electrical properties. In all embodiments described herein, AlN crystal 120 may also include gallium (Ga), rendering it an AlGaN crystal. For example, Ga may be added to polycrystalline source 130 such that the crystal coalesces as AlGaN. In such a case, the crystal may have an Al concentration greater than approximately 50%. AlN crystal 120 may have a thickness of greater than approximately 0.1 mm and a diameter greater than approximately 1 cm. The diameter may even be greater than approximately 2 cm.

Figure 2:
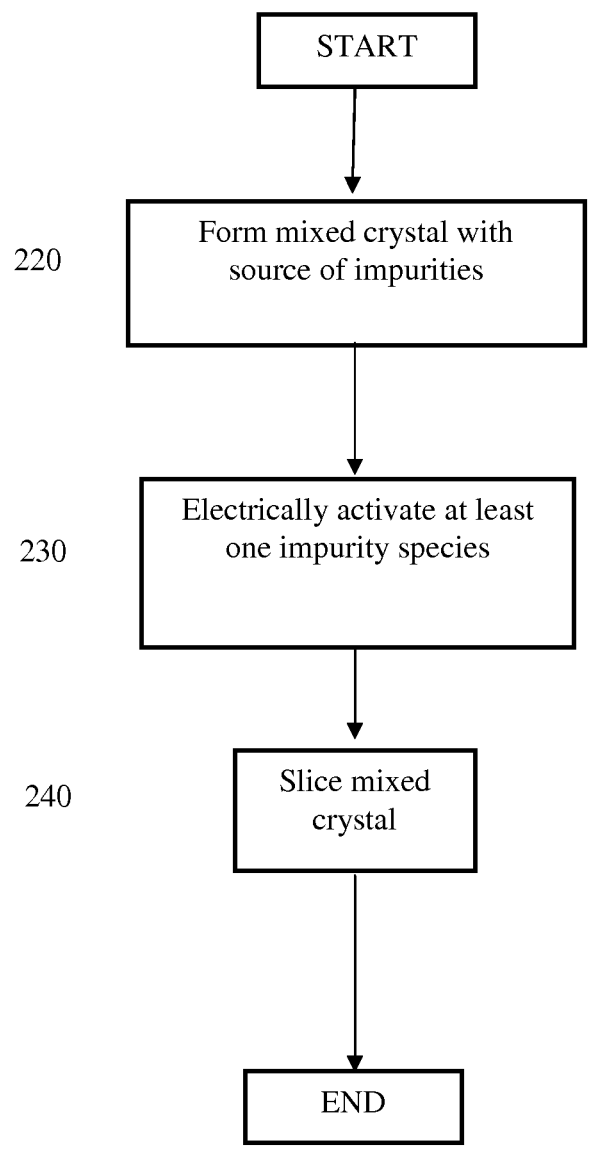
FIG. 2 is a flow chart of a process for forming doped AlN according to many embodiments of the invention.

FIG. 2 illustrates a process 200 for forming a p-type AlN crystal. In step 220, AlN crystal 120, a mixed crystal containing AlN and a source of substitutional or interstitial impurities (i.e., at least one species of dopants), is formed by sublimation-recondensation at a temperature of approximately 2000° C. to approximately 2300° C. The source of the plurality of substitutional impurities is $Be_3N_2$, $Mg_3N_2$, $Zn_3N_2$, $Li_3N$, BeO, $BeSiN_2$, LiBeN, $Be_2C$, $MgSiN_2$, $LiSi_2N_3$, LiMgN, LiZnN, or another suitable material. The corresponding substitutional impurities include Be, Mg, Zn, O, or others. The compound $Be_3N_2$ melts at about 2200° C. and decomposes in 1 bar of $N_2$ at ~2250° C. to liquid Be+$N_2$. The metal Be boils at 2970° C. The compound $Mg_3N_2$ decomposes in 1 bar of $N_2$ at 800 to 900° C. Magnesium melts at 649° C. and boils at 1090° C. In step 230, at least a portion of the plurality of substitutional or interstitial impurities inside AlN crystal 120 is electrically activated. In an embodiment, $Be_3N_2$ is converted to $Be_3N_3$ by a high pressure treatment in a nitrogen ambient, thus electrically activating the Be dopant. Pressures of $N_2$ up to 100 MPa at temperatures up to 2,300° C. and times up to several weeks may be needed. The human toxicity of Be, however, must be borne in mind for commercial applications. In step 240, AlN crystal 120 is sliced into wafers through the use of a wire saw or a diamond annular saw for direct use, or for subsequent epitaxial growth of semiconductor layers and/or device integration thereon.

The doping of AlN may also be accomplished by introducing two or more different elements into the crystal during or after growth. Using two elements is herein referred to as bi-doping; for three elements it is termed tri-doping. The bi-doping approach can be divided into two classes.

The first class is "asymmetric bi-doping" (ABD) in which the two impurities represent a donor element and an acceptor element, and are introduced in approximately equal concentrations. However, at high concentrations, the interaction between the donors is different from that between the acceptors. This difference in the formation of many-body states such as impurity bands and impurity complexes in addition to the activation energies of the isolated single atom impurities is the source of the asymmetry. The donor-acceptor pairs preferably have special properties. Suitable compounds that act as sources for the plurality of impurities include $MgSiN_2$ and $BeSiN_2$. In $MgSiN_2$ or $BeSiN_2$ the Mg or Be acceptors occupy the Al cation lattice site as do the compensating Si donors. Thus, they do not form nearest neighbor pairs in the lattice, and net doping (and hence high conductivity) results.

In the case of $MgSiN_2$ the donors and acceptors do not pair up at the high growth temperature. At doping levels above $10^{18}$ cm$^{-3}$, the Mg, Be, or Si species start to form impurity bands where the holes on the Mg or Be can move from one impurity atom to the nearest identical impurity atom to form a p-type sub-band. When one of the impurity species is Si atoms, the Si wavefunction overlap can form an n-type sub-band. The resultant, doped AlN crystal can be either n-type or p-type depending on which sub-band forms first as the dopant concentration increases. Preferably, impurity species concentrations greater than approximately $10^{18}$ cm$^{-3}$ are introduced, and, even more preferably, concentrations up to $2 \times 10^{22}$ cm$^{-3}$ are introduced. One suitable impurity species source, $BeSiN_2$, is infinitely soluble in solid AlN. (See G. Schneider, L. J. Gauckler, and G. Petzow, J. Am. Ceram. Soc., Vol. 63, p. 32 (1980), the entire disclosure of which is hereby incorporated by reference.) Likewise, $MgSiN_2$ has a high solubility in AlN. Since Si is a shallow donor in AlN and Mg is a deeper acceptor, AlN doped with $MgSiN_2$ is generally n-type.

Another example of the ABD method of making p-type AlN is to place the two different impurities on the N anion lattice sites in AlN. This can be accomplished by making mixed crystals of AlN with $Al_2OC$. The solid solubility of $Al_2OC$ in AlN is as large as $3 \times 10^{22}$ cm$^{-3}$ for both oxygen and carbon. See C. Qui and R. Metselaar, J. Am. Ceram. Soc., Vol. 80, p. 2013 (1997) ("the Qui reference"), the entire disclosure of which is hereby incorporated by reference. In this case, the point defect sources are $Al_2O_3$ and $Al_4C_3$. The gas ambient may include CO, $Al_2O$, AlCN or various mixtures of these three gases, and the substitutional impurities may include C and O.

Carbon may be preferred as a p-type dopant for AlN due to its low toxicity. The compound $Al_4C_3$ exists as yellow crystals. In an inert graphite crucible, it peritectically decomposes at 2156° C. In 100 kPa of $N_2$ above 1500° C., it does not exist: the $Al_4C_3$ reacts with $N_2$ to form AlN and C. Crystals of AlN can be grown by the sublimation-recondensation method in 100 kPa of $N_2$ at 2000° C. to 2300° C. in carbon (graphite) crucibles. They grow well, are yellow in color, and contain hundreds of small, black graphite flakes per cm$^3$ distributed throughout the crystal. The main carbon transport vapor molecule is AlCN. The excess carbon comes out of solution as the crystal anneals at high temperature. The growing time at temperature is approximately 150 hours. These crystals do not conduct electricity at room temperature, possibly because the relatively small amount of C which is introduced into the N lattice site as a substitutional impurity is compensated by N vacancies.

Carbon can be introduced as a substitutional impurity on the nitrogen sites very effectively by employing the compound $Al_2OC$. The compound $Al_2OC$ exists and has almost the same crystal structure as AlN. It is miscible in the solid state with AlN at high temperature from zero to about 40 mole % $Al_2OC$. Both $N_2$ and CO molecules contain 14 electrons. Crystals of $Al_2OC$ themselves are non-conducting. The oxygen impurity enters as a deep donor (on the nitrogen site) and appears to compensate the shallower carbon acceptor. An important factor in successfully growing $Al_2OC$-doped crystals is properly heat-treating them during or after growth to get a uniform, bulk electrical conductivity. This example of ABD depends on the fact that the C acceptor level is significantly shallower than the O donor level and, thus, the $Al_2OC$ compound will effectively act as a p-type dopant at high doping concentrations.

The second class of bi-doping is also asymmetric in the sense that one impurity is substitutional while the other is interstitial. Examples of some useful compounds for bi-doping AlN are LiBeN, LiMgN, and LiZnN. The elements Be, Mg, and Zn will tend to go into the AlN crystal as substitutional impurities while Li will tend to be an interstitial impurity. As an interstitial impurity, the Li atom will be relatively mobile in the AlN lattice. Thus, AlN crystal doped with LiBeN may be electrically activated by extracting the Li ions and leaving the Be in place, resulting in a p-type, electrically conducting semiconductor. The extraction can be carried out by heating the doped AlN crystal under vacuum to evaporate the Li, by immersing the crystal or crystal slices in a liquid gallium (Ga) or indium (In) molten-metal bath, or by drifting the Li to the surface in an applied direct-current (DC) electric field. The Be acceptors (or Mg or Zn) are either isolated, uncompensated acceptors or at higher concentrations form a p-type sub-band. This method of making conducting AlN is termed extraction-activated bi-doping (EABD). Again, the bi-doping permits the AlN to be doped to very high levels of impurity content, which is often not possible with mono-doping employing Be, Mg or Zn by themselves.

Another application of the EABD method of making p-type AlN involves fabrication of an AlN mixed crystal with the compound $LiSi_2N_3$. The Li, which is in this case a substitutional impurity on that Al cation lattice site, is then extracted as indicated above to leave an AlN crystal doped with $V_{Al}Si_2N_3$ (i.e., there are two Si atoms on Al sites for every one Al vacancy). This leaves the crystal as a net p-type semiconductor. However, care should be taken to avoid annealing out too many of the aluminum vacancies ($V_{Al}$) during this process (by going, for instance, to too high a temperature) since a crystal doped with $V_{Al}Si_3N_4$ (i.e., three Si atoms for every one $V_{Al}$) would be completely compensated and would not conduct at low doping concentrations.

Figure 3:
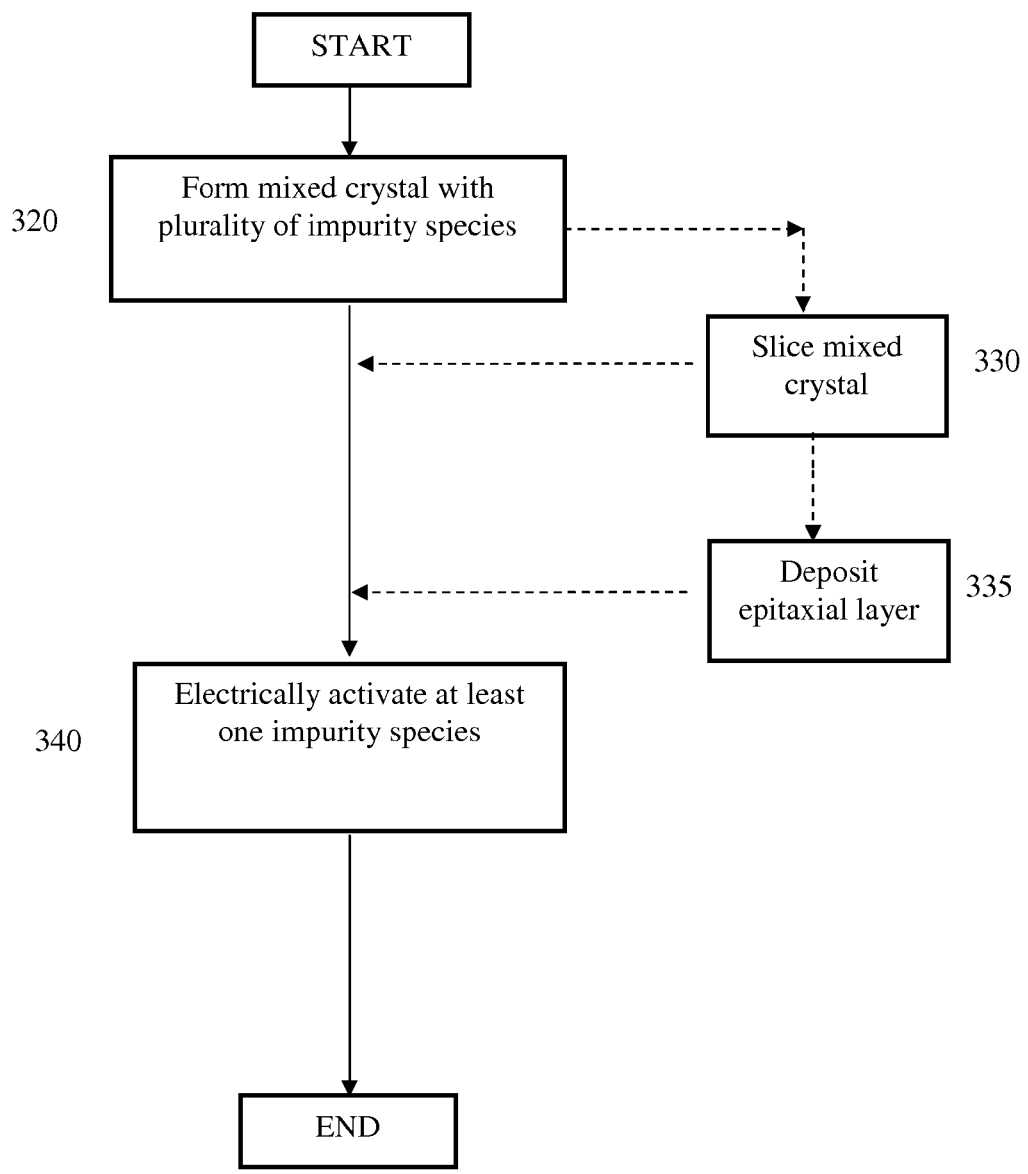
FIG. 3 is a flow chart of a process for forming doped AlN according to other embodiments of the invention.

FIG. 3 illustrates an alternate process 300 for forming a doped AlN crystal. In step 320, AlN crystal 120, a mixed crystal containing AlN and a plurality of impurity species (i.e., different types of dopant atoms), is formed by sublimation-recondensation at a temperature of approximately 2000° C. to approximately 2300° C. The impurity species may include substitutional dopants such as C, O, Be, Mg, Zn, and Si, and/or interstitial dopants such as Li. The impurity species may be introduced by utilizing a compound such as $MgSiN_2$, $BeSiN_2$, $Al_2OC$, LiBeN, LiMgN, LiZnN, or $LiSi_2N_3$ (i.e., a source of one or more impurity species) as a portion of polycrystalline source 130, or by introducing gaseous precursors thereof to vapor mixture 110 such that AlN crystal 120 includes the compound and/or impurity species of interest. At this point, prior to electrical activation, AlN crystal 120 may have a low electrical conductivity, e.g., less than approximately $10^{-2}\ \Omega^{-1}\ cm^{-1}$ at room temperature, because the plurality of impurity species may compensate each other. AlN crystal 120 may even have an electrical conductivity less than approximately $10^{-5}\ \Omega^{-1}\ cm^{-1}$.

In order to obtain very high concentrations of C on the N anion site in the AlN, a mixed polycrystalline material may be made with 0.1 to 50 mole % of $Al_2OC$ and 99.9 to 50 mole % of AlN. The mixed polycrystalline material is then used as polycrystalline source 130 for growing doped AlN crystals. The mixed polycrystalline source material could be formed by mixing appropriate ratios of AlN and $Al_2OC$ powders and sintering. However, the $Al_2OC$ structure is rather unstable when pure, and is best stabilized by making mixed crystals of it with AlN. This can be done under carefully controlled conditions which take advantage of the thermodynamic properties of $Al_4C_3$, AlN, and $Al_2O_3$.

One such approach to make $AlN-Al_2OC$ polycrystalline material is to add $Al_2O_3$ powder to the Al—N—C mix (specifically, either (i) AlN plus C powders, or (ii) AlN, C and Al powders, or (iii) AlN and $Al_4C_3$ powders) and heat it in order to incorporate a relatively high concentration of $Al_2OC$ into the AlN. This reaction is preferably carried out in the temperature range 1700° C. to 2000° C. where $Al_2OC$ is thermodynamically stable (see, for example, the Qui reference and Y. Larrere, et al., Rev. Int. Hautes Temp. Refract. Fr., Vol. 21, p. 3 (1984), the entire disclosure of which is hereby incorporated by reference). We can calculate that the highest pressure for stability at 2000° C. is about 1 bar. The $Al_2O_3$ plus Al—N—C powders can be cold pressed and then sintered in a threaded-top graphite cylinder at temperatures up to 1990° C. However, the sintering will produce a somewhat porous sample so it is better to hot-press the powders in a tightly sealed graphite die for 2 to 3 hours at about 1900° C. The sealing prevents the gases from leaking out of the pressing die and altering the chemical composition. The use of reactive hot-pressing takes advantage of the 5% volume shrinkage in the reaction of $Al_2O_3$ with $Al_4C_3$ to form $Al_2OC$. It is desirable to cool the mix under pressure to prevent back-reaction. The hot-pressing yields samples with >98.5% of theoretical density as has been shown by S. Y. Kuo and A. V Virkar, J. Am. Ceram. Soc., Vol. 73, p. 2640 (1990), the entire disclosure of which is hereby incorporated by reference.

Growth of AlN crystals with doped polycrystalline material is desirably undertaken with careful attention to the type of crystal growth enclosure 100. For instance, with the use of $AlN-Al_2OC$ polycrystalline starting material, it may be preferable to use a crystal growth enclosure 100 made of TaC or graphite (C).

In an embodiment, the plurality of impurity species includes at least one donor and at least one acceptor. Furthermore, such pairs of impurity species may occupy either cation or anion lattice sites in the AlN lattice. For example, the compound $Al_2OC$ may act as a source of donor species O and acceptor species C, both of which occupy anion (N) lattice sites. In contrast, compounds such as $BeSiN_2$, $MgSiN_2$, and $ZnSiN_2$ may act as sources of donor species Si and acceptor species Be, Mg, and Zn, all of which occupy cation (Al) lattice sites.

With continued reference to FIG. 3, combinations of interstitial and substitutional impurity species may also be introduced in step 320. For example, compounds such as LiBeN, LiMgN, or LiZnN may supply Li as an interstitial impurity and species such as Be, Mg, Zn, or Si as substitutional impurities. In this case, the presence of both the interstitial impurity and the substitutional impurity may leave AlN crystal 120 substantially intrinsic until the interstitial impurity is extracted in subsequent step 340 (described below). Another example is $LiSi_2N_3$ doping, in which both the Li and Si will be substitutional impurities on the Al cation site. Thus, AlN crystal 120 may have a low electrical conductivity, e.g., less than approximately $10^{-2}\ \Omega^{-1}\ cm^{-1}$ at room temperature, until the much more mobile substitutional Li impurity is extracted in subsequent step 340 (described below). AlN crystal 120 may even have an electrical conductivity less than approximately $10^{-5}\ \Omega^{-1}\ cm^{-1}$ at this stage.

In an embodiment, the source of O impurities is $Al_2O_3$, which supplies point defects in the form of Al vacancies and substitutional O to AlN crystal 120. The $Al_2O_3$ point defect source provides Al vacancies because the $Al_2O_3$ actually dissolves as $Al_2V_{Al}O_3$, where $V_{Al}$ denotes one Al vacancy. At the growing temperature of 2300° C. and at low concentrations of $Al_2O_3$, the O atoms will be randomly distributed on the N sites and the Al vacancies are randomly distributed on the Al sites. During slow cooling, the O atoms may tend to cluster around the Al vacancies because they are slightly larger in diameter than the N atoms, resulting in a stress-relief clustering. This clustering can be prevented by rapid cooling of the crystal from the growth temperature over a period of 30 minutes or less. The rapid cooling will result in an AlN crystal with unclustered point defects of O on the N anion lattice sites and Al vacancies.

In optional step 330, AlN crystal 120, now including at least one impurity species, is sliced into wafers. In optional step 335, an epitaxial layer is deposited on at least one wafer of AlN crystal 120. The epitaxial layer may include AlN, GaN, InN, or alloys or mixtures thereof. The epitaxial layer may have an Al concentration greater than 50%. (Thus, for an $Al_xGa_{1-x}N$ epitaxial layer, x may be greater than 0.5.) During step 335, the epitaxial layer may be doped with at least one impurity species, e.g., O. The epitaxial layer may have a thickness of approximately 0.5 micrometers (μm) to 200 μm. In step 340, at least one impurity species in at least a portion of AlN crystal 120 (and/or in an epitaxial layer deposited thereon), now optionally in wafer form, is electrically activated to form a doped crystal. The crystal (and/or epitaxial layer deposited thereon) may have a net n-type or p-type doping level after electrical activation. Electrical activation may be accomplished by, for example, annealing AlN crystal 120 a temperature range of approximately 2000° C. to approximately 2300° C.

When an interstitial impurity species has been introduced in step 320, step 340 may include methods of extracting the interstitial impurity species while leaving one or more substitutional impurity species activated in AlN crystal 120. In such an embodiment, step 340 may include annealing AlN crystal 120 in a vacuum at a temperature above 300° C. but below 1600° C. (to avoid excessive damage to the AlN host crystal) to evaporate the interstitial impurity species, immersing AlN crystal 120 or wafers therefrom in a liquid gallium (Ga) or indium (In) molten-metal bath, or applying a voltage to AlN crystal 120 in order to drift the interstitial impurity species to the surface.

Step 340 may include annealing in an ambient which may supply at least one additional impurity species to AlN crystal

120. In an embodiment, AlN crystal 120 is annealed at a temperature range of approximately 2000° C. to approximately 2300° C. In the case of an O impurity, the temperature is chosen so as to prevent clustering or to redissolve the O—$V_{Al}$ clusters. The ambient is an atmosphere of, e.g., 90% $N_2$+10% CO at 30 bars, and the anneal time is, e.g., 24 hours with longer times needed for thicker wafers. Some of the CO diffuses into the crystal while some nitrogen and oxygen diffuse out. Thus, the anneal step incorporates C, an additional impurity species, into AlN crystal 120. Similarly, if an epitaxial layer is present on a wafer of AlN crystal 120, such an anneal may supply an additional impurity species to the epitaxial layer. Thus, the epitaxial layer may include a plurality of impurity species, at least one of which is electrically activated.

Once step 340 is complete, AlN crystal 120 and/or an epitaxial layer deposited thereon may have desirable electrical characteristics. These include, for example, an electrical conductivity greater than approximately $10^{-5}$ $\Omega^{-1}$ $cm^{-1}$ at room temperature, or even greater than approximately $3\times10^{-3}$ $\Omega^{-1}$ $cm^{-1}$ at room temperature. The electrical conductivity may even be greater than approximately 0.1 $\Omega^{-1}$ $cm^{-1}$ at room temperature. The mobility of AlN crystal 120 and/or an epitaxial layer deposited thereon may be greater than approximately 25 $cm^2$ $V^{-1}$ $s^{-1}$ at room temperature.

The result is a quaternary crystal which is predominately AlN but with high concentrations of O and C on the N lattice sites. It will also have a certain concentration of Al vacancies ($V_{Al}$) due to excess O. During slow cooling, some of the excess O may again cluster about the Al vacancies but the C atoms, being less mobile than the O atoms, do not. The C is in, and stays in solution on the N sites and the C concentration is comparable or greater than the O concentration. AlN crystal 120 is now a good p-type conductor (conductivity $\sigma > 3\times10^{-3}$ $\Omega^{-1}$ $cm^{-1}$ at room temperature). In preferred embodiments, AlN crystal 120 has a mobility greater than 25 $cm^2$ $V^{-1}$ $s^{-1}$ at room temperature because the high concentration of C creates a de-localized acceptor band while the deeper donor levels caused by the O remain localized. Preferred AlN crystals have dimensions exceeding 2 mm by 2 mm by 1 mm with conductivities greater than $10^{-5}$ $\Omega^{-1}$ $cm^{-1}$ at room temperature.

The activation energy for this p-type dopant will depend on its concentration, but because of the high solubility of both $Al_2OC$ and $Al_2V_{Al}O_3$ in AlN it is possible to make degenerately doped p-type AlN as well as lightly doped material. It is desirable that the C concentration exceed approximately $1\times10^{18}$ $cm^{-3}$ to achieve practical p-type conductivities. Very high C concentrations (up to approximately $2\times10^{22}$ $cm^{-3}$) are possible with this technique, and such concentrations are useful for obtaining high p-type doping levels (and higher conductivities).

The $Al_2O_3$ and CO doping and annealing treatments are generally important to control the p-type doping present. In a preferred embodiment, the atom ratio of O to C is approximately one-to-one (1:1) and a large fraction of the C is activated. If more O than this is present, there will be fewer C centers activated, while a lower concentration of O may cause the C to precipitate out and be electrically inactive.

It will be seen that the techniques described herein provide a basis for production of doped crystals and epitaxial layers including AlN and AlGaN. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. An extraction-activated bi-doped p-type AlN crystal doped with a plurality of $V_{Al}Si_2N_3$ complexes.

2. The AlN crystal of claim 1, wherein a mobility thereof is greater than approximately 25 $cm^2$ $V^{-1}$ $s^{-1}$ at room temperature.

3. The AlN crystal of claim 1, wherein a conductivity thereof is conductivity greater than approximately $10^{-5}$ $\Omega^{-1}$ $cm^{-1}$ at room temperature.

4. The AlN crystal of claim 1, wherein a conductivity thereof is conductivity greater than approximately $3\times10^{-3}$ $\Omega^{-1}$ $cm^{-1}$ at room temperature.

5. The AlN crystal of claim 1, wherein a concentration of $V_{Al}Si_2N_3$ complexes within the AlN crystal is larger than a concentration of $V_{Al}Si_3N_4$ complexes within the AlN crystal.

6. The AlN crystal of claim 1, wherein the AlN crystal is disposed within a semiconductor device.

7. The AlN crystal of claim 1, wherein a thickness thereof is at least approximately 0.1 mm and a diameter thereof is at least approximately 1 cm.

8. The AlN crystal of claim 7, wherein the diameter is at least approximately 2 cm.

9. The AlN crystal of claim 1, wherein dimensions thereof are at least 2 mm by 2 mm by 1 mm.

10. A bi-doped, p-type AlN crystal having a mobility greater than approximately 25 $cm^2$ $V^{-1}$ $s^{-1}$ at room temperature, the bi-doped AlN crystal being doped with both (i) a donor species comprising 0 and (ii) an acceptor species comprising C, wherein (i) both the donor species and the acceptor species occupy anion lattice sites in the AlN crystal and (ii) at least portions of the donor species and the acceptor species are present within the AlN crystal as $Al_2OC$ compounds.

11. The AlN crystal of claim 10, wherein a conductivity thereof is conductivity greater than approximately $10^{-5}$ $\Omega^{-1}$ $cm^{-1}$ at room temperature.

12. The AlN crystal of claim 10, wherein a conductivity thereof is conductivity greater than approximately $3\times10^{-3}$ $\Omega^{-1}$ $cm^{-1}$ at room temperature.

13. The AlN crystal of claim 10, wherein the AlN crystal is disposed within a semiconductor device.

14. The AlN crystal of claim 10, wherein a thickness thereof is at least approximately 0.1 mm and a diameter thereof is at least approximately 1 cm.

15. The AlN crystal of claim 14, wherein the diameter is at least approximately 2 cm.

16. The AlN crystal of claim 10, wherein dimensions thereof are at least 2 mm by 2 mm by 1 mm.

17. The AlN crystal of claim 1, further comprising an epitaxial layer disposed thereover.

18. The AlN crystal of claim 17, wherein the epitaxial layer comprises at least one of AlN, GaN, InN, or an alloy or mixture thereof.

19. The AlN crystal of claim 17, wherein the epitaxial layer comprises $Al_xGa_{1-x}N$.

20. The AlN crystal of claim 19, wherein x is greater than 0.5.

21. The AlN crystal of claim 10, further comprising an epitaxial layer disposed thereover.

22. The AlN crystal of claim 21, wherein the epitaxial layer comprises at least one of AlN, GaN, InN, or an alloy or mixture thereof.

23. The AlN crystal of claim 21, wherein the epitaxial layer comprises $Al_xGa_{1-x}N$.

24. The AlN crystal of claim 23, wherein x is greater than 0.5.

* * * * *